United States Patent
Lenniger

(10) Patent No.: US 7,932,598 B2
(45) Date of Patent: Apr. 26, 2011

(54) CONNECTION BETWEEN A SEMICONDUCTOR HOUSING AND A BASE PLATE COMPRISING A PASSAGE OPENING FOR FASTENING TO A HEAT SINK

(75) Inventor: Andreas Lenniger, Anroechte (DE)

(73) Assignee: Infineon Technologies AG, Munich (DE)

( * ) Notice: Subject to any disclaimer, the term of this patent is extended or adjusted under 35 U.S.C. 154(b) by 688 days.

(21) Appl. No.: 11/313,838

(22) Filed: Dec. 20, 2005

(65) Prior Publication Data

US 2006/0151872 A1    Jul. 13, 2006

Related U.S. Application Data

(63) Continuation of application No. PCT/EP2004/005519, filed on May 21, 2004.

(30) Foreign Application Priority Data

Jun. 27, 2003   (DE) .................................. 103 29 102

(51) Int. Cl.
*H01L 23/34* (2006.01)
*H01L 23/12* (2006.01)

(52) U.S. Cl. ......... 257/727; 257/E23.086; 257/E23.083; 257/731

(58) Field of Classification Search .................. 257/706, 257/678, 727, E23.086, 276, 684, 718, 719, 257/731–733, 708, E23.083

See application file for complete search history.

(56) References Cited

U.S. PATENT DOCUMENTS

| | | | | |
|---|---|---|---|---|
| 3,023,346 | A | * | 2/1962 | Wagner ......................... 257/668 |
| 3,875,478 | A | * | 4/1975 | Capstick ....................... 361/767 |
| 4,646,203 | A | | 2/1987 | Ngo et al. ..................... 361/388 |
| 4,839,716 | A | * | 6/1989 | Butt .............................. 257/660 |
| 5,278,446 | A | * | 1/1994 | Nagaraj et al. ................ 257/707 |
| 5,592,021 | A | * | 1/1997 | Meschter et al. .............. 257/727 |
| 5,767,576 | A | | 6/1998 | Kobayashi et al. ........... 257/701 |
| 6,020,635 | A | * | 2/2000 | Murphy ......................... 257/727 |
| 6,219,244 | B1 | * | 4/2001 | Chen ............................. 361/704 |
| 6,238,222 | B1 | * | 5/2001 | Kuo et al. ........................ 439/92 |
| 6,370,027 | B1 | | 4/2002 | Koizumi et al. .............. 361/720 |
| 6,449,156 | B1 | * | 9/2002 | Han et al. ...................... 361/704 |
| 6,472,742 | B1 | | 10/2002 | Bhatia et al. .................. 257/713 |
| 6,483,702 | B1 | | 11/2002 | Lofland ......................... 361/704 |
| 6,492,202 | B1 | | 12/2002 | Lober et al. ................... 438/122 |

(Continued)

FOREIGN PATENT DOCUMENTS

DE    197 21 061 A1    11/1997

(Continued)

OTHER PUBLICATIONS

International Search Report for PCT/EP2004/005519, 4 pages, Mailing Date Nov. 2, 2004.
International Preliminary Report of Patentability for PCT/EP2004/005519, 7 pages, Mailing Date Jan. 12, 2006.

*Primary Examiner* — Wael M Fahmy
*Assistant Examiner* — Sarah K Salerno
(74) *Attorney, Agent, or Firm* — Coats & Bennett, P.L.L.C.

(57) ABSTRACT

A semiconductor module has a housing (2) and a metal base plate (3). A reliable yet easily producible force-transmitting connection between a semiconductor module and an external heat sink is provided by a mechanical pressure-proof counterpart (4) which is incorporated into the housing (2) and forms a firm connection (14) with a pressure-proof connecting element (10) on the base plate side. The connection is provided with a passage opening (12) for fastening the semiconductor module to the heat sink.

20 Claims, 1 Drawing Sheet

U.S. PATENT DOCUMENTS

| | | | |
|---|---|---|---|
| 6,509,629 B2 * | 1/2003 | Yoshimatsu et al. | 257/660 |
| 6,861,747 B2 | 3/2005 | Miyazaki et al. | 257/718 |
| 2003/0214028 A1 * | 11/2003 | Brechignac et al. | 257/706 |
| 2004/0051172 A1 * | 3/2004 | Miyazaki et al. | 257/706 |

FOREIGN PATENT DOCUMENTS

| | | |
|---|---|---|
| EP | 0 989 606 A2 | 9/1999 |
| EP | 1 381 081 A1 | 1/2004 |
| WO | 02/084733 A1 | 10/2002 |

* cited by examiner

CONNECTION BETWEEN A SEMICONDUCTOR HOUSING AND A BASE PLATE COMPRISING A PASSAGE OPENING FOR FASTENING TO A HEAT SINK

CROSS-REFERENCE TO RELATED APPLICATION

This application is a continuation of co-pending International Application No. PCT/EP2004/005519 filed May 21, 2004 which designates the United States, and claims priority to German application number DE 103 29 102.4 filed Jun. 27, 2003.

TECHNICAL FIELD

The invention lies in the area of the construction of power semiconductor modules and relates to a semiconductor module with a housing and with a metal base plate.

BACKGROUND

In the case of this tried-and-tested construction of semiconductor modules that is known per se (DE 197 21 061 A1), usually one or more power semiconductor chips are arranged on a substrate and contacted on the rear side. The underside of the substrate is copper-clad and acts as a heat-dissipating contact area, to allow power losses occurring in the form of heat to be dissipated during the operation of the semiconductor components. For this purpose, it is surface-connected to a base plate, for example by soldering.

This arrangement is surrounded by a frame or (plastic) module housing and may be pressed onto a heat sink, for example by means of screwed connections. The generalizing term housing is to be understood hereafter as meaning both a frame, which may also be part of a multipart housing, and a module housing. For optimum heat dissipation, planar, complete surface contact is desired between the underside of the base plate and a cooling element or heat sink that dissipates heat, for example by convective air flow.

To maintain adequate surface contact, however, significant pressing forces are required, usually achieved by the module user or final customer by means of screwed connections. The pressing forces thereby act via the housing, and consequently also on the housing. Depending on the housing material that is used, it has the tendency in the long term to undergo material deformations caused by so-called flowing. In other words, the form of the housing in the region of the connections or where the force is introduced is not stable in the long term, so that the connections become loose and consequently the pressing forces are undesirably reduced. This is problematical in particular in the case of the widespread use of plastic housings.

SUMMARY

The object of the present invention is to provide a semiconductor module which allows a force-generating or force-introducing connection between the semiconductor module and an external heat sink that is reliable even in the long term and nevertheless can be easily produced. At the same time, it is intended that this connection does not adversely affect the planar underside of the base plate via which the heat dissipation to the cooling element takes place.

This object can be achieved by a semiconductor module comprising a housing comprising a mechanically pressure-resistant counterpart, and a metal base plate comprising a pressure-resistant connecting element which forms a firm connection with the mechanically pressure-resistant counterpart, wherein the connection comprises a passage opening for fastening the semiconductor module on a heat sink.

The pressure-resistant connecting element can be arranged on a top side of said metal base plate. The connecting element can be a rivet element and forms a riveted connection with the counterpart. The connecting element can be formed as an integral part from material of the base plate. The counterpart may comprise positively engaging elements in its peripheral region. The positively engaging elements can be a knurl.

The object can, thus, be achieved in particular by a semiconductor module with a housing and with a metal base plate by incorporating in the housing a mechanically pressure-resistant counterpart, which forms a firm connection with a pressure-resistant connecting element on the base plate side, and by the connection having a passage opening for fastening the semiconductor module on a heat sink.

An important aspect of the invention is that the elements serving for the connection (counterpart in the housing and connecting element on the base plate side) are formed from mechanically pressure-resistant, preferably metallic, material and can therefore also absorb the forces generated by the screwed connection passing through and can introduce these forces into the housing without significant material deformation or material flow.

The assembly forces required to produce the riveted connection also act on the pressure-resistant parts, so that to this extent there is no risk of the housing being damaged and there is an extremely reliable connection between the base plate and the housing.

A refinement of the semiconductor module according to the invention that is preferred from a production engineering aspect provides that the connecting element on the base plate side is a rivet element and forms a riveted connection with the counterpart. From a production engineering aspect, riveted connections can be easily and inexpensively handled. A further refinement of the semiconductor module according to the invention that is preferred from a production engineering aspect provides that the rivet element is formed as an integral part of the base plate material. This can take place particularly advantageously directly during the punching out of the base plate.

An advantageous development of the invention provides that the counterpart has positively engaging elements, in particular knurling, in its peripheral region. As result, a firm fit of the counterpart is ensured particularly easily, it being advantageously possible for the counterpart to be molded directly along with the housing in the case of a housing produced by the injection-molding process.

BRIEF DESCRIPTION OF THE DRAWINGS

The invention is explained in more detail below on the basis of an exemplary embodiment represented in the figures of the drawing, in which.

DETAILED DESCRIPTION

Figure 1:
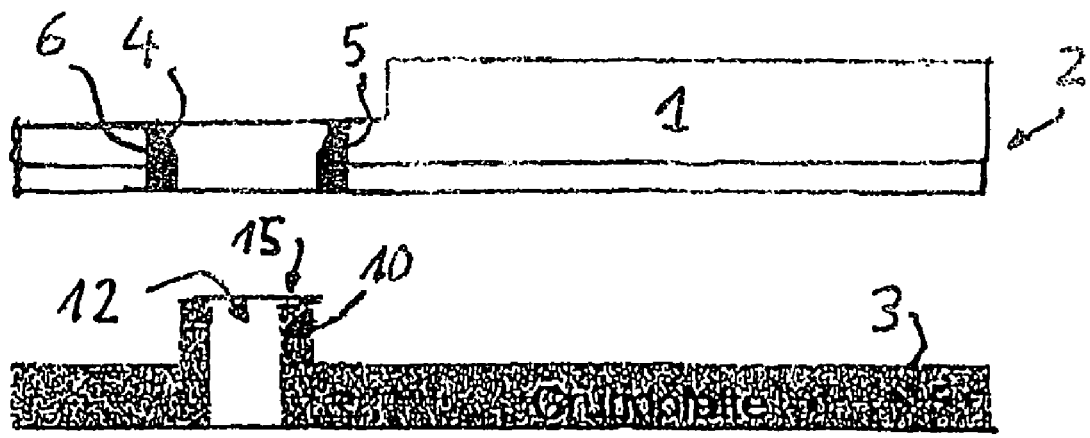
FIG. 1 shows a detail taken from a semiconductor module according to the invention in longitudinal section before assembly and FIG. 2 shows the detail from FIG. 1 after formation of a riveted connection.

The semiconductor module represented in an enlarged form in side view in FIG. 1 is an arrangement known per se with a multiplicity of individual power semiconductors—not represented in any more detail—which are respectively connected in an electrically conducting manner with the rear side to a conducting layer of a substrate.

The substrate and the semiconductor components are surrounded by a frame 1, which is part of a plastic housing 2. The housing 2 is screwed to a cooling element or heat sink (not represented) by means of screwed connections, in order to dissipate lost heat occurring during operation from the substrate via a base plate 3 to the heat sink.

Embedded in the frame 1 or the housing 2 is a mechanically pressure-resistant counterpart 4, which has been molded along with the housing 2, formed from plastic, during its production. Like the base plate 3, the counterpart preferably consists of metal and has positively engaging elements 6 in the form of knurling in its peripheral region 5. By this means, the counterpart is anchored particularly firmly in the housing 2.

The base plate 3 has a mechanically pressure- and tension-resistant connecting element 10. It is designed as a passage and dimensioned in such a way that the counterpart is drawn through far enough to produce a firm connection. In principle, this connection could be formed by a screw nut that is firmly supported on the counterpart being screwed onto a corresponding external thread on the casing of the passage 10. It is also conceivable to provide a firm non-positively engaging or material-bonded connection between the counterpart and the passage. The connection has a passage opening 12 for the (screwed) fastening of the semiconductor module on a heat sink.

Figure 2:
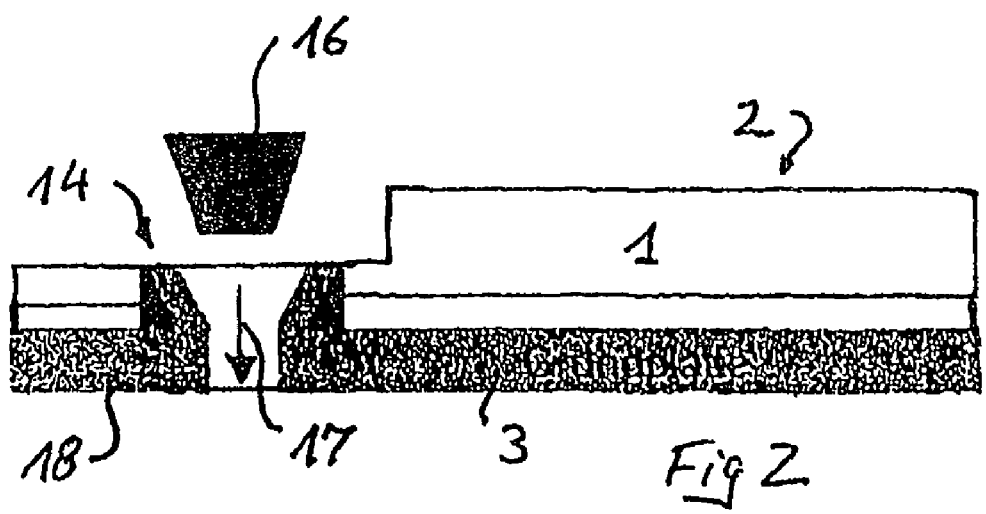

It is preferred from a production engineering aspect for the connection to be designed in the way represented in FIG. 2, as a firm riveted connection 14. For this purpose, the connecting element 10 on the base plate side is designed as a rivet element 15, which is formed as an integral part from the base plate material. The rivet element forms the riveted connection 14 with the counterpart 4, which is formed as a thrust piece. Represented in FIG. 2 is the riveting die 16, which is used for producing the riveted connection and, during its movement in the direction of the arrow 17, has deformed the upper region of the passage 10 and pressed it conically against the inner side of the counterpart 4. Apart from allowing easy and inexpensive production, this refinement has the important advantage that the underside 18 of the base plate is entirely unaffected and undeformed by the riveting operation. This also has favorable effects on the heat transfer to the cooling element.

LIST OF DESIGNATIONS

1 frame
2 housing
3 base plate
4 counterpart
5 peripheral region
6 positively engaging elements
10 connecting element
12 passage opening
14 riveted connection
15 rivet element
16 riveting die
17 arrow
18 underside

I claim:

1. A semiconductor module comprising:
   a housing comprising a mechanically pressure-resistant counterpart having an opening extending from one end of the mechanically pressure-resistant counterpart to an opposing end with a tapered sidewall, and a frame surrounding a plurality of semiconductor components electrically connected to a conducting layer of a substrate, and
   a metal base plate comprising a pressure-resistant connecting element having an end inserted into the opening in the mechanically pressure-resistant counterpart with a sidewall in contact with the tapered sidewall of the mechanically pressure-resistant counterpart which forms a firm connection with the mechanically pressure-resistant counterpart, wherein the connection comprises a passage opening extending completely through both the housing and the metal base plate.

2. A semiconductor module as claimed in claim 1, wherein the pressure-resistant connecting element is arranged on a top side of said metal base plate.

3. A semiconductor module as claimed in claim 2, wherein the connecting element is a rivet element and forms a riveted connection with the counterpart.

4. A semiconductor module as claimed in claim 1, wherein the connecting element is formed as an integral part from material of the base plate.

5. A semiconductor module as claimed in claim 1, wherein the counterpart comprises positively engaging elements in its peripheral region.

6. A semiconductor module as claimed in claim 5, wherein the positively engaging elements is a knurl.

7. A semiconductor module comprising:
   a plastic housing comprising a mechanically pressure-resistant counterpart molded as part of the plastic housing so that each outer side of the mechanically pressure-resistant counterpart is fixedly connected to a portion of the plastic housing, the mechanically pressure-resistant counterpart having an opening extending from one end of the mechanically pressure-resistant counterpart to an opposing end with a tapered sidewall; and
   a metal base plate comprising a pressure-resistant rivet arranged on a top side of said metal base plate and having an end inserted into the opening in the mechanically pressure-resistant counterpart with a sidewall in contact with the tapered sidewall of the mechanically pressure-resistant counterpart which forms a riveted connection with the mechanically pressure-resistant counterpart, wherein the riveted connection comprises a passage opening extending completely through both the plastic housing and the metal base plate.

8. A semiconductor module as claimed in claim 7, wherein the rivet is formed as an integral part from material of the base plate.

9. A semiconductor module as claimed in claim 7, wherein the counterpart comprises positively engaging elements in its peripheral region.

10. A semiconductor module as claimed in claim 9, wherein the positively engaging elements is a knurl.

11. A semiconductor module comprising:
    a housing comprising a frame surrounding a plurality of semiconductor components and a mechanically pressure-resistant counterpart embedded in the frame, the mechanically pressure-resistant counterpart having an opening extending from one end of the mechanically pressure-resistant counterpart to an opposing end with a tapered sidewall,
    a metal base plate comprising a pressure-resistant rivet formed as an integral part of the base plate and having an end inserted into the opening in the mechanically pressure-resistant counterpart with a sidewall in contact with the tapered sidewall of the mechanically pressure-resistant counterpart which forms a riveted connection with the mechanically pressure-resistant counterpart, wherein the riveted connection comprises a passage opening extending completely through both the plastic housing and the metal base plate.

12. A semiconductor module as claimed in claim 11, wherein the counterpart comprises positively engaging elements in its peripheral region.

13. A semiconductor module as claimed in claim 12, wherein the positively engaging elements is a knurl.

14. A semiconductor module as claimed in claim 1, wherein the housing is made of plastic and the mechanically pressure-resistant counterpart is molded as part of the plastic housing so that each outer side of the mechanically pressure-resistant counterpart is fixedly connected to a portion of the plastic housing.

15. A semiconductor module as claimed in claim 1, wherein the mechanically pressure-resistant counterpart is embedded in the frame.

16. A semiconductor module as claimed in claim 1, wherein an upper region of the pressure-resistant connecting element is pressed conically against the tapered sidewall of the mechanically pressure-resistant counterpart.

17. A semiconductor module as claimed in claim 7, wherein the plastic housing further comprises a frame surrounding a plurality of semiconductor components and the mechanically pressure-resistant counterpart is embedded in the frame.

18. A semiconductor module as claimed in claim 7, wherein an upper region of the pressure-resistant rivet is pressed conically against the tapered sidewall of the mechanically pressure-resistant counterpart.

19. A semiconductor module as claimed in claim 11, wherein the housing is made of plastic and the mechanically pressure-resistant counterpart is molded as part of the plastic housing so that each outer side of the mechanically pressure-resistant counterpart is fixedly connected to a portion of the plastic housing.

20. A semiconductor module as claimed in claim 11, wherein an upper region of the pressure-resistant rivet is pressed conically against the tapered sidewall of the mechanically pressure-resistant counterpart.

* * * * *